United States Patent
Ho et al.

(10) Patent No.: US 11,190,201 B2
(45) Date of Patent: Nov. 30, 2021

(54) ANALOG TO DIGITAL CONVERTER DEVICE AND CAPACITOR WEIGHT CALIBRATION METHOD

(71) Applicant: REALTEK SEMICONDUCTOR CORPORATION, Hsinchu (TW)

(72) Inventors: Hsuan-Ting Ho, Hsinchu (TW); Liang-Wei Huang, Hsinchu (TW); Shih-Hsiung Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/099,827

(22) Filed: Nov. 17, 2020

(65) Prior Publication Data
US 2021/0218409 A1 Jul. 15, 2021

(30) Foreign Application Priority Data
Jan. 13, 2020 (TW) .................................. 109101024

(51) Int. Cl.
*H03M 1/10* (2006.01)
*H03M 1/06* (2006.01)
*H03M 1/80* (2006.01)
*H03M 1/46* (2006.01)

(52) U.S. Cl.
CPC ....... *H03M 1/1009* (2013.01); *H03M 1/0602* (2013.01); *H03M 1/1033* (2013.01); *H03M 1/468* (2013.01); *H03M 1/804* (2013.01); *H03M 1/10* (2013.01)

(58) Field of Classification Search
CPC .... H03M 1/1009; H03M 1/0602; H03M 1/10; H03M 1/38; H03M 1/40; H03M 1/403

USPC ................................ 341/118, 120, 163, 172
See application file for complete search history.

(56) References Cited

U.S. PATENT DOCUMENTS

| 8,451,151 B2* | 5/2013 | Lin | H03M 1/1061 341/110 |
| 8,514,114 B2* | 8/2013 | Kapusta | H03M 1/1057 341/120 |
| 8,842,027 B2* | 9/2014 | Huang | H03M 1/1057 341/120 |

(Continued)

OTHER PUBLICATIONS

C. Lee, C. Lu, R. Narayanaswamy and J. B. Rizk, "A 12b 70MS/s SAR ADC with digital startup calibration in 14nm CMOS," 2015 Symposium on VLSI.

*Primary Examiner* — Khai M Nguyen
(74) *Attorney, Agent, or Firm* — WPAT, PC

(57) ABSTRACT

An analog to digital converter device includes a capacitor array, a digital logic circuit, and a comparator circuit. The capacitor array includes first capacitors, a capacitor to be calibrated, and compensation capacitors. The digital logic circuit performs a calibration on the capacitor to be calibrated, in order to calibrate a weighed value of the capacitor to be calibrated according to a decision signal, and converts an input signal to bits via the capacitor array after the calibration is performed. The comparator circuit compares a testing signal with a predetermined voltage to generate the decision signal. The testing signal is generated by the first capacitors and the capacitor to be calibrated in response to the calibration. The digital logic circuit further selects at least one of the compensation capacitors, in order to adjust a digital code corresponding to a calibrated weighed value to be an integer expressed by the bits.

14 Claims, 3 Drawing Sheets

(56) References Cited

U.S. PATENT DOCUMENTS 9,106,246 B2 * 8/2015 Yang ................. H03M 1/38
9,154,152 B1 10/2015 Chiu et al.
9,432,037 B2 8/2016 Oh et al.

* cited by examiner

ANALOG TO DIGITAL CONVERTER DEVICE AND CAPACITOR WEIGHT CALIBRATION METHOD

BACKGROUND OF THE INVENTION

1. Field of the Invention

The present disclosure relates to an analog-to-digital converter device. More particularly, the present disclosure relates to a successive approximation register analog to digital converter having a capacitor weight calibration.

2. Description of Related Art

Analog to digital converters have been widely utilized in various electronic devices, in order to generate digital signals for subsequent processing. In current approaches, various calibration mechanisms are utilized to increase a resolution of the analog to digital converter. For example, a calibration mechanism is employed to calibrate a digital weight corresponding to a capacitor or a current source, in order to generate a corresponding digital code. However, in the above approaches, if the digital code is not a value able to be expressed by expected number of bits of the analog to digital converter, the resolution of the analog to digital converter is decreased. In order to express such digital code, the number of bits of the analog to digital converter is increased, which results in a higher cost.

SUMMARY OF THE INVENTION

In some embodiments, an analog to digital converter device includes a capacitor array, a digital logic circuit, and a comparator circuit. The capacitor array includes a plurality of first capacitors, a capacitor to be calibrated, and a plurality of compensation capacitors. The digital logic circuit is configured to perform a calibration on the capacitor to be calibrated, in order to calibrate a weighed value of the capacitor to be calibrated according to a decision signal, and to convert an input signal to a plurality of bits via the capacitor array after the calibration is performed. The comparator circuit is configured to compare a testing signal with a predetermined voltage to generate the decision signal. The testing signal is generated by the plurality of first capacitors and the capacitor to be calibrated in response to the calibration. The digital logic circuit is further configured to select at least one of the plurality of compensation capacitors, in order to adjust a digital code corresponding to a calibrated weighed value to be an integer expressed by the plurality of bits.

In some embodiments, a capacitor weight calibration method includes the following operations: performing a calibration on a capacitor to be calibrated in an analog to digital converter device, in order to calibrate a weighted value of the capacitor to be calibrated according to a decision signal, in which the analog to digital converter device is configured to convert an input to a plurality of bits; comparing a testing signal with a predetermined voltage, in order to generate the decision signal, wherein the testing signal is generated by a plurality first capacitors and the capacitor to be calibrated in the analog to digital converter device in response to the calibration; and selecting at least one of a plurality of compensation capacitors according to the weighted value, in order to adjust a digital code corresponding to a calibrated weighted value to be an integer expressed by the plurality of bits.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other.

In this document, the term "circuit" may indicate an object, which is formed with one or more transistors and/or one or more active/passive elements based on a specific arrangement, for processing signals. As used herein, the term "and/or" includes any and all combinations of one or more of the associated listed items.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments.

For ease of understanding, like elements in various figures are designated with the same reference number.

Figure 1:
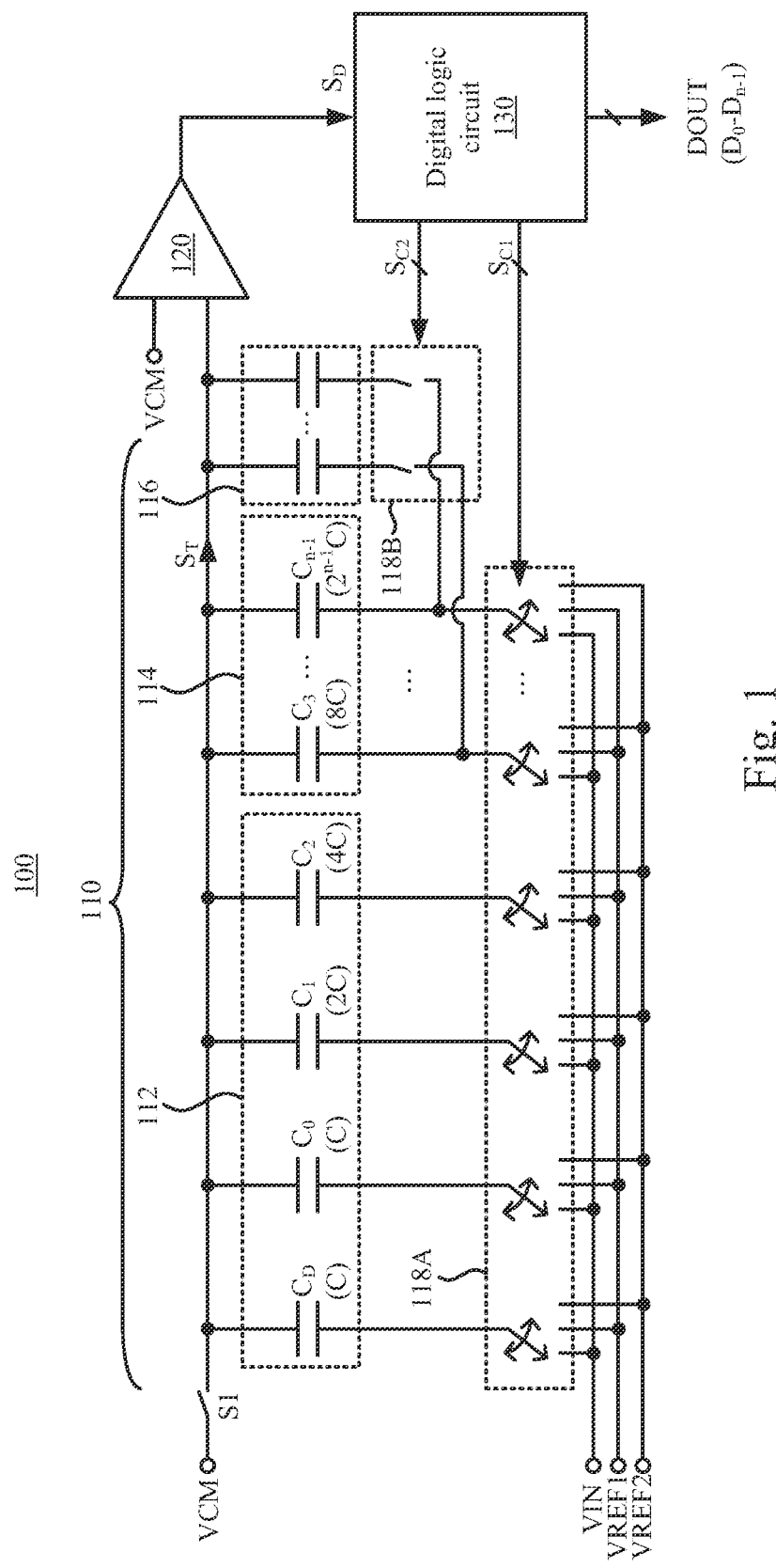
FIG. 1 is a schematic diagram of an analog-to-digital converter device according to some embodiments of the present disclosure.

FIG. 1 is a schematic diagram of an analog-to-digital converter (ADC) device 100 according to some embodiments of the present disclosure. In some embodiments, the ADC device 100 is a successive approximation register (SAR) ADC.

The ADC device 100 includes a capacitor array 110, a comparator circuit 120, and a digital logic circuit 130. In normal operations, a terminal of the capacitor array 110 receives a predetermined voltage VCM (or referred to as a common mode voltage) via a switch S1, and another terminal of the capacitor array 110 samples an input signal VIN. The digital logic circuit 130 controls the capacitor array 110 according to a decision signal $S_D$ outputted from the comparator circuit 120. As a result, the capacitor array 110 and the comparator circuit 120 cooperate with each other to convert the sampled input signal VIN to n bits $D_0$-$D_{n-1}$, in which n is a positive integer. The n bits $D_0$-$D_{n-1}$ define a digital code DOUT. For example, if n is 5, the digital code DOUT may be any integer of 0-31 (i.e., 00000 to 11111).

Before performing the above conversion, the digital logic circuit 130 performs a calibration to calibrate a weighted value of capacitor(s) to be calibrated in the capacitor array 110. After the calibration is performed, the digital logic circuit 130 performs the above conversion via the capacitor array 110. In some embodiments, such calibration is referred to as a foreground calibration.

The capacitor array 110 includes a least significant bit (LSB) capacitor unit 112, a most significant bit (MSB) capacitor unit 114, a compensation capacitor unit 116, a switching circuit 118A, and a switching circuit 118B. The LSB capacitor unit 112 includes a dummy capacitor $C_D$ and capacitors $C_0$-$C_2$. The MSB capacitor unit 114 includes capacitors $C_3$-$C_{n-1}$ which are capacitors to be calibrated. The dummy capacitor $C_D$ and the capacitor $C_0$ are capacitors having lowest capacitance value in the LSB capacitor unit 112, and a capacitance value of these two capacitors is set to be a unit capacitor C. Capacitance values of the capacitors $C_1$-$C_{n-1}$ are sequentially set to be twice of the unit capacitor C (i.e., 2C, in which 2 can be considered as a predetermined weighted value of the capacitor C1), four times of the unit capacitor C (i.e., 4C), . . . , and $2^{n-1}$ times of the unit capacitor C (i.e., $2^{n-1}$C). In the calibration progress, the digital logic circuit 130 acquires a weighted value of one capacitor to be calibrated (e.g., the capacitor $C_3$) via the LSB capacitor unit 112. The compensation capacitor unit 116 adjusts the weighted value of the capacitor to be calibrated based on the control of the digital logic circuit 130. An exemplary arrangement of the compensation capacitor unit 116 is given with reference to embodiments shown in FIG. 2.

The switching circuit 118A includes switches configured to selectively transmit the input signal VIN, a reference voltage VREF1, or a reference voltage VREF2 (which may be, for example, a ground voltage or a negative reference voltage) to the dummy capacitor $C_D$ and the capacitors $C_0$-$C_{n-1}$ according to control signals $S_{C1}$ generated from the digital logic circuit 130. The switching circuit 118B includes switches configured to selectively couple at least one compensation capacitor in the compensation capacitor unit 116 in parallel to a corresponding capacitor to be calibrated (e.g., capacitor $C_3$) according to control signals $S_{C2}$ generated from the digital logic circuit 130, in order to adjust a digital code, corresponding to the calibrated weighted value of the corresponding capacitor to be calibrated, to be an integer able to be expressed by the bits $D_0$-$D_{n-1}$. The above calibration and operations of adjusting the weighted values are described with reference to FIG. 3.

Figure 2:
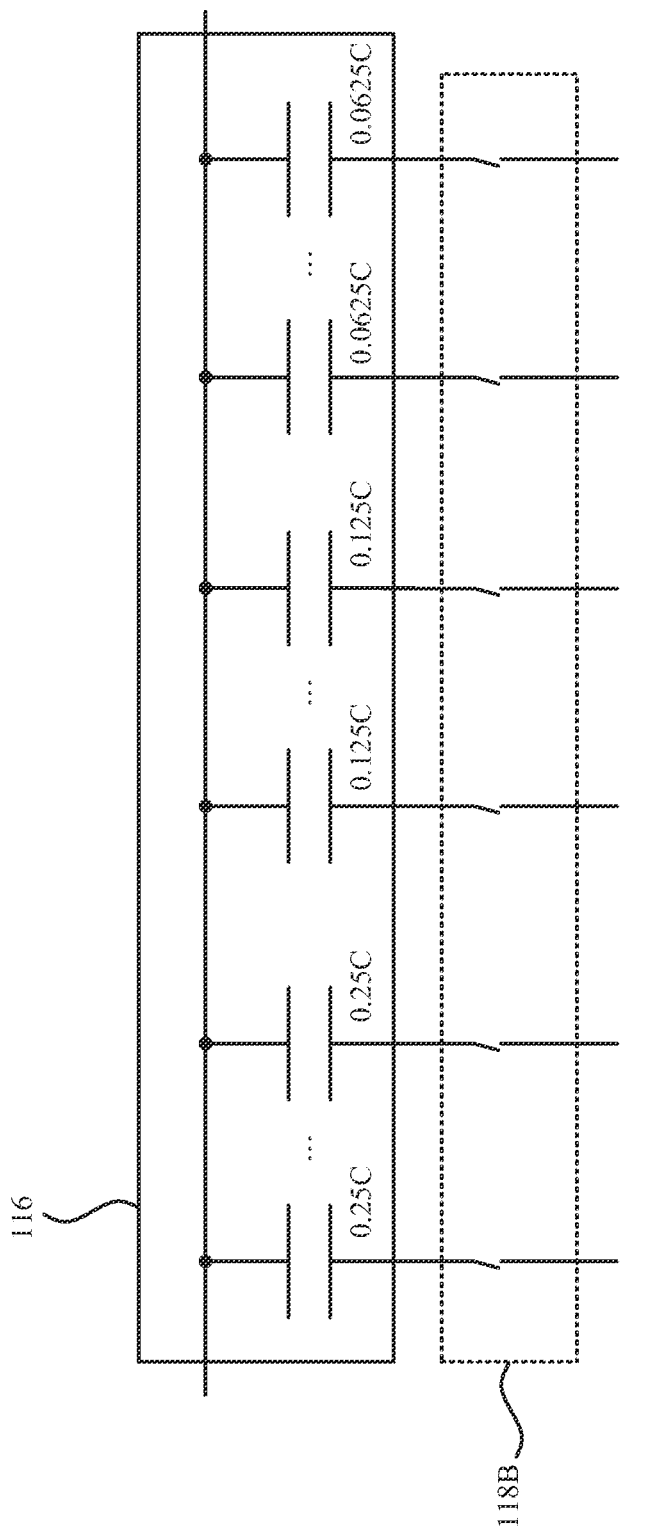
FIG. 2 is a schematic diagram of the compensation capacitor unit in FIG. 1 according to some embodiments of the present disclosure.

FIG. 2 is a schematic diagram of the compensation capacitor unit 116 in FIG. 1 according to some embodiments of the present disclosure. The compensation capacitor unit 116 includes compensation capacitors, which may be, for example, compensation capacitors each having a capacitance value of 0.25C, compensation capacitors each having a capacitance value of 0.125C, and compensation capacitors each having a capacitance value of 0.0625C. In some embodiments, the capacitance value of each of the compensation capacitors is set to be less than or equal to 0.25 times of the unit capacitor C, but the present disclosure is not limited thereto. These compensation capacitors are selectively coupled in parallel to the capacitors to be calibrated in the MSB capacitor unit 114 via the switching circuit 118B.

Figure 3:
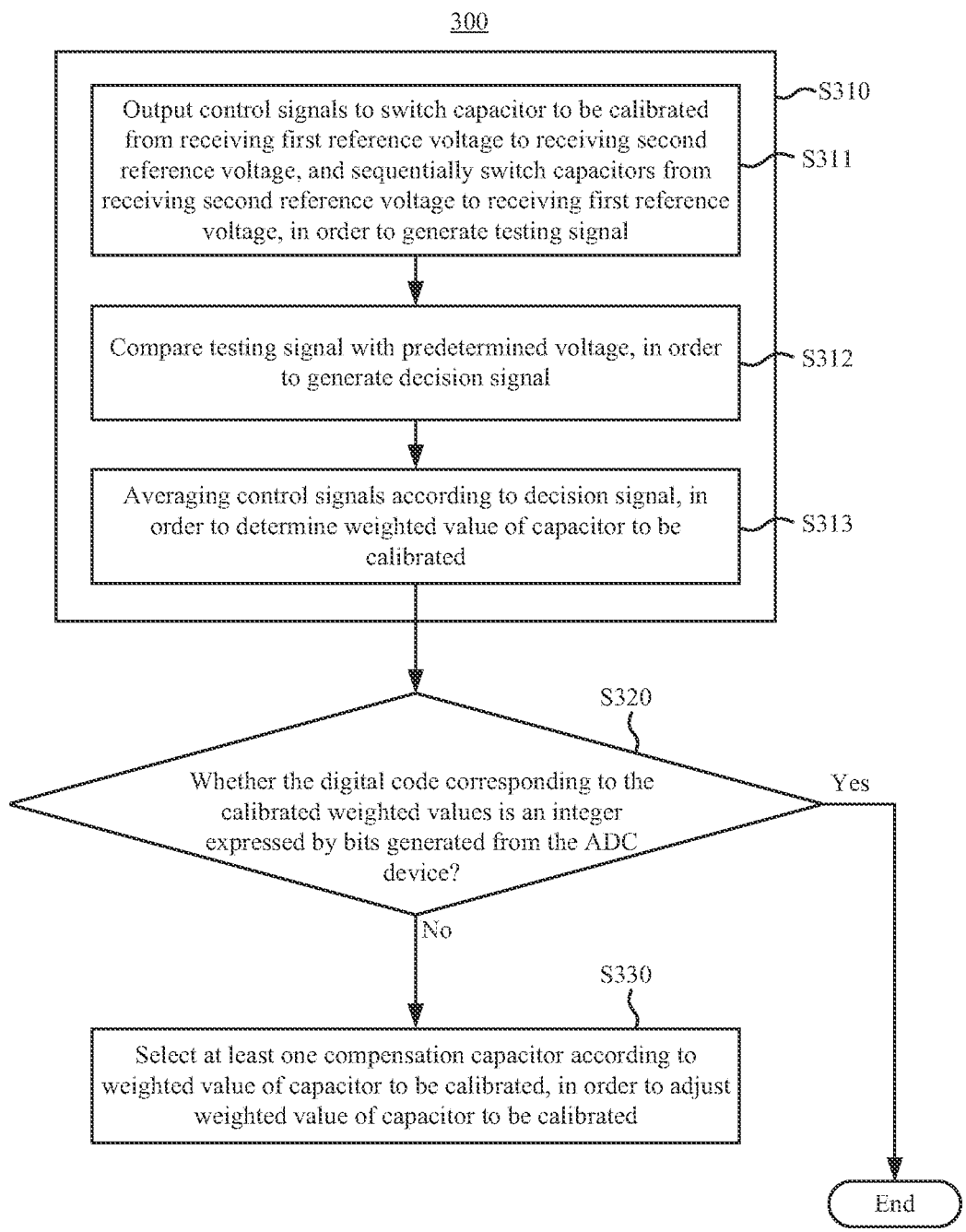
FIG. 3 is a flow chart of a capacitor weight calibration method according to some embodiments of the present disclosure.

FIG. 3 is a flow chart of a capacitor weight calibration method 300 according to some embodiments of the present disclosure. In some embodiments, the capacitor weight calibration method 300 may be performed by the digital logic circuit 130 in FIG. 1. In some embodiments, the digital logic circuit 130 may be implemented with digital circuit(s), a state machine, and/or logic circuit(s) that performs the capacitor weight calibration method 300, but the present disclosure is not limited thereto.

In operation S310, a calibration of a capacitor to be calibrated is performed, in order to calibrate the weighted value of the capacitor to be calibrated. In operation S320, whether the digital code corresponding to the calibrated weighted values is an integer expressed by bits generated from the ADC device is determined. If the digital code corresponding to the calibrated weighted values is not the integer expressed by the bits generated from the ADC device, operation S330 is performed. If the digital code corresponding to the calibrated weighted values is the integer expressed by the bits generated from the ADC device, the capacitor weight calibration method 300 is ended without selecting the compensation capacitor. In some embodiments, step S311 is performed again to calibrate another one capacitor to be calibrated.

Taking the capacitor $C_3$ being the capacitor to be calibrated as an example, the predetermined voltage VCM is set to be the half of the reference voltage VREF1, and a capacitance value of the capacitor $C_3$ is ideal to be a sum of the capacitance values of all capacitors in the LSB capacitor unit 112 (i.e., C+C+2C+4C=8C). A testing signal $S_T$ is a divided voltage generated by the LSB capacitor unit 112 and the capacitor $C_3$ according to the reference voltage VREF1. Before the calibration is started, the digital logic circuit 130 outputs the control signals $S_{C1}$, in order to control the capacitor $C_3$ to receive the reference voltage VREF1 via the switching circuit 118A, and to control the dummy capacitor $C_D$ and the capacitors $C_0$-$C_2$ to receive the reference voltage VREF2. In an initial calibration, the digital logic circuit 130 switches a corresponding one of the control signals $S_{C1}$, in order to switch the capacitor $C_3$ to be calibrated from receiving the reference voltage VREF1 to receiving the reference voltage VREF2 via the switching circuit 118A, in order to generate the testing signal $S_T$ (i.e., step S311). Under this condition, the testing signal $S_T$ is ideal to be the half of the reference voltage VREF1. If the weighted value of the capacitor $C_3$ is inaccurate (i.e., $C_3$ is not 8C), the testing signal $S_T$ is different from the half of the reference voltage VREF1. By comparing the testing signal $S_T$ with the predetermined voltage VCM, the comparator circuit 120 outputs the corresponding decision signal $S_D$ (i.e., step S312). In the next calibration, the digital logic circuit 130 adjusts a corresponding one of the control signals $S_{C1}$ in response to the decision signal $S_D$, in order to switch the capacitor $C_2$ from receiving the reference voltage VREF2 to receiving the reference voltage VREF1 (i.e., step S311). As a result, the testing signal $S_T$ is changed, and thus the comparator circuit 120 generates a new decision signal $S_D$ (i.e., step S312). By this analogy, when the digital logic circuit 130 detects that the decision signal $S_D$ is toggled between a logic value of 1 and a logic value of 0, the digital logic circuit 130 averages the control signals $S_{C1}$ that trigger such toggling, in order to determine the weighted value of the capacitor $C_3$ (i.e., step S313).

The digital logic circuit 130 determines an error between the weighted value and a predetermined weighted value of the capacitor $C_3$, in order to calibrate the weighted value. For example, if an effective number of bits (ENOB) of the ADC device 100 is 11 (i.e., n=11), the ADC device 100 is expected to generate 11 bits $D_0$-$D_{10}$. In a binary configuration, the predetermined weighted value of the capacitor $C_3$ is 8 (i.e., ideally, the capacitor $C_3$ is 8C), and the digital code corresponding to the capacitor $C_3$ is 16 (in view of differential signals) before the calibration is performed. If the weighted value of the capacitor $C_3$ is 7, the digital logic circuit 130 is able to calibrate the weighted value of the capacitor $C_3$ according to the error between the predetermined weighted value and the weighted value. According to the calibrated weighted value, the digital code corresponding to the capacitor $C_3$ is 14, and the digital code 14 is an integer able to be expressed by the 11 bits $D_0$-$D_{10}$. Under this condition, the digital logic circuit 130 stops performing the calibration (or continues calibrating a next capacitor to be calibrated). Similarly, if the weighted value of the capacitor $C_3$ is 8.5, the digital code corresponding to the calibrated weighted value of the capacitor $C_3$ is 17, and the digital code 17 is the integer able to be expressed by the 11 bits $D_0$-$D_{10}$. Under this condition, the digital logic circuit 130 stops performing the calibration (or continues calibrating a next capacitor to be calibrated).

The above operations of calibrating weighted values are given for illustrative purposes, and the present disclosure is not limited thereto. In some embodiments, the digital logic circuit 130 may store the error and the calibrated weighted values as a lookup table for the subsequent analog-to-digital conversion. In some embodiments, the above detailed operations of calibrating weighted values can be understood with reference to a related paper (A 12b 70MS/s SAR ADC with digital startup calibration in 14 nm CMOS, Symp. VLSI Circuits, June 2015.).

Under certain cases, the digital code corresponding to the weighted value of the capacitor $C_3$ is not the integer able to be expressed by the 11 bits $D_0$-$D_{10}$. Under this condition, the ENOB of the ADC device 100 is decreased. For example, if the weighted value of the capacitor is determined to be 8.25, and the digital code corresponding to the weighted value of the capacitor $C_3$ is 16.5, which is not the integer able to be expressed by the 11 bits $D_0$-$D_{10}$. As a result, the digital logic circuit 130 may determine that the digital code corresponding to the capacitor $C_3$ is 16 or 17. If this weighted value is not adjusted, the ENOB is decreased from 11 bits to 10.5 bits. Under this condition, the digital logic circuit 130 performs operation S330, in order to adjust this weighted value.

With continued reference to FIG. 3, in operation S330, at least one compensation capacitor is selected according to the weighted value of the capacitor to be calibrated, in order to adjust the weighted value of the capacitor to be calibrated. In the above examples, the weighted value of the capacitor $C_3$ is 8.25. The digital logic circuit 130 outputs the control signals $S_{C2}$, in order to select at least one compensation capacitor from the compensation capacitor unit 116 via the switching circuit 118B, and to couple the at least one compensation capacitor in parallel to the capacitor $C_3$ to adjust the weighted value of the capacitor $C_3$. In this example, the digital logic circuit 130 selects one compensation capacitor having the capacitance value of 0.25C, in order to adjust the weighted value of the capacitor $C_3$ from 8.25 to 8.5. As result, according to the calibrated weighted value, the digital code corresponding to the capacitor $C_3$ is 17, which is the integer able to be expressed by the 11 bits $D_0$-$D_{10}$.

With the above operations, the digital logic circuit 130 is able to determine whether the digital code corresponding to the calibrated weighed value(s) is able to be expressed by the 11 bits. If the digital code is not the integer able to be expressed by the 11 bits, the digital logic circuit 130 further utilizes the compensation capacitor to adjust the weighted value, in order to adjust the digital code to be the integer able to be expressed by the 11 bits. As a result, the ENOB of the ADC device 100 is prevented from being decreased. In a binary configuration, a value, being less than 1 and greater than 0, in the weighted value of the capacitor to be calibrated is y (e.g., a fraction part of the weighted value). If the value y is less than 0.5, the digital logic circuit 130 utilizes the compensation capacitor to calibrate the value y to be 0.5 (e.g., 8.25 is calibrated to be 8.5, in which 8.25 is the weighted value and the value y is 0.25). If the value y is greater than 0.5, the digital logic circuit 130 utilizes the compensation capacitor to calibrate the weighted value to be a positive integer being closet to the weighted value (e.g., 8.625 is calibrated to be 9, in which 8.625 is the weighted value and the value y is 0.625).

In some related approaches, in order to express the digital code of 16.5, the ENOB of the ADC device is required to be increased by one bit. However, if the ENOB of the ADC device is increased, cost for subsequent circuits configured to process the output of the ADC device is significantly increased. Compared with these approaches, the ADC device 100 in some embodiments of the present disclosure is able to calibrate the weighted value via the compensation capacitor unit 116, in order to adjust the digital code to be the integer expressed by the original bits. As a result, the ENOB of the ADC device 100 is maintained, and thus the cost of the subsequent circuits is not increased.

A number of circuits and/or a number of bits in the above figures are given for illustrative purposes. According to different practical requirements, the number of circuits (e.g., capacitors) and/or the number of bits in the above figures can be adjusted correspondingly. The above examples are given with the binary configuration, but the present disclosure is not limited thereto. In some embodiments, the ADC device 100 and the capacitor weight calibration method 300 are also able to be applied to non-binary operations.

As described above, the ADC device and the capacitor weight calibration method provided in some embodiments of the present disclosure are able to utilize the compensation capacitor to calibrate the weighted value of the capacitor to be calibrated, without affecting the resolution of the ADC device and costs for sequent circuits.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely some embodiments of the present disclosure, without any intention to limit the scope of the present disclosure thereto.

Various equivalent changes, alterations, or modifications based on the claims of present disclosure are all consequently viewed as being embraced by the scope of the present disclosure.

What is claimed is:

1. An analog to digital converter device, comprising:
   a capacitor array comprising a plurality of first capacitors, a capacitor to be calibrated, and a plurality of compensation capacitors, wherein a capacitance value of each of the plurality of compensation capacitors is less than a capacitance value of each of the plurality of first capacitors;
   a digital logic circuit configured to perform a calibration on the capacitor to be calibrated, in order to calibrate a weighed value of the capacitor to be calibrated according to a decision signal, and to convert an input signal to a plurality of bits via the capacitor array after the calibration is performed; and
   a comparator circuit configured to compare a testing signal with a predetermined voltage to generate the decision signal, wherein the testing signal is generated by the plurality of first capacitors and the capacitor to be calibrated in response to the calibration, and the digital logic circuit is further configured to select at least one of the plurality of compensation capacitors, in order to adjust a digital code corresponding to a calibrated weighed value to be an integer expressed by the plurality of bits.

2. The analog to digital converter device of claim 1, wherein the digital logic circuit is configured to output a plurality of first control signals according to the decision signal, in order to switch the capacitor to be calibrated from receiving a first reference voltage to receiving a second reference voltage, and to sequentially switch the plurality of first capacitors from receiving the second reference voltage to receiving the first reference voltage, in order to generate the testing signal.

3. The analog to digital converter device of claim 2, wherein the digital logic circuit is configured to average the plurality of first control signals to determine the weighted value, and to determine whether the digital code is the integer expressed by the plurality of bits, in order to select the at least one of the plurality of compensation capacitors.

4. The analog to digital converter device of claim 3, wherein if the weighted value is not the integer expressed by the plurality of bits, the digital logic circuit is configured to output a plurality of second control signals, in order to couple the at least one of the plurality of compensation capacitors in parallel to the capacitor to be calibrated.

5. The analog to digital converter device of claim 1, wherein a capacitor having a smallest capacitance value in the plurality of first capacitors is a unit capacitor, and a capacitance value of each of the plurality of compensation capacitors is set to be less than or equal to 0.25 times of a capacitance value of the unit capacitor.

6. The analog to digital converter device of claim 1, wherein if a value being less than 1 and greater than 0 in the weighed value is less than 0.5, the digital logic circuit is configured to select the at least one of the plurality of compensation capacitors, in order to adjust the value to be 0.5.

7. The analog to digital converter device of claim 1, wherein if a value being less than 1 and greater than 0 in the weighed value is higher than 0.5, the digital logic circuit is configured to select the at least one of the plurality of compensation capacitors, in order to adjust the weighted value to a positive integer closet to the weighted value.

8. A capacitor weight calibration method, comprising:
   performing a calibration on a capacitor to be calibrated in an analog to digital converter device, in order to calibrate a weighted value of the capacitor to be calibrated according to a decision signal, wherein the analog to digital converter device is configured to convert an input to a plurality of bits;
   comparing a testing signal with a predetermined voltage, in order to generate the decision signal, wherein the testing signal is generated by a plurality first capacitors and the capacitor to be calibrated in the analog to digital converter device in response to the calibration; and
   selecting at least one of a plurality of compensation capacitors according to the weighted value, in order to adjust a digital code corresponding to a calibrated weighted value to be an integer expressed by the plurality of bits, wherein a capacitance value of each of the plurality of compensation capacitors is less than a capacitance value of each of the plurality of first capacitors.

9. The capacitor weight calibration method of claim 8, wherein selecting the at least one of the plurality of compensation capacitors according to the weighted value comprises:
   if a value being less than 1 and greater than 0 in the weighed value is less than 0.5, selecting the at least one of the plurality of compensation capacitors, in order to adjust the value to be 0.5.

10. The capacitor weight calibration method of claim 8, wherein selecting the at least one of the plurality of compensation capacitors according to the weighted value comprises:
    if a value being less than 1 and greater than 0 in the weighed value is higher than 0.5, selecting the at least one of the plurality of compensation capacitors, in order to adjust the weighted value to a positive integer closet to the weighted value.

11. The capacitor weight calibration method of claim 8, wherein performing the calibration on the capacitor to be calibrated comprises:
    outputting a plurality of first control signals according to the decision signal, in order to switch the capacitor to be calibrated from receiving a first reference voltage to receiving a second reference voltage; and
    sequentially switching the plurality of first capacitors from receiving the second reference voltage to receiving the first reference voltage, in order to generate the testing signal.

12. The capacitor weight calibration method of claim 11, further comprising:
    averaging the plurality of first control signals to determine the weighted value, and to determining whether the digital code is the integer expressed by the plurality of bits, in order to select the at least one of the plurality of compensation capacitors.

13. The capacitor weight calibration method of claim 12, wherein if the weighted value is not the integer expressed by the plurality of bits, the at least one of the plurality of compensation capacitors is selected to be coupled in parallel to the capacitor to be calibrated.

14. The capacitor weight calibration method of claim 8, wherein a capacitor having a smallest capacitance value in the plurality of first capacitors is a unit capacitor, and a capacitance value of each of the plurality of compensation capacitors is set to be less than or equal to 0.25 times of a capacitance value of the unit capacitor.

* * * * *